(12) United States Patent
Simpson

(10) Patent No.: US 8,892,380 B2
(45) Date of Patent: Nov. 18, 2014

(54) DATA MEASUREMENT METHODS AND SYSTEMS

(75) Inventor: Gary R. Simpson, Fontana, CA (US)

(73) Assignee: Maury Microwave, Inc., Tustin, CA (US)

( * ) Notice: Subject to any disclaimer, the term of this patent is extended or adjusted under 35 U.S.C. 154(b) by 1160 days.

(21) Appl. No.: 12/509,219

(22) Filed: Jul. 24, 2009

(65) Prior Publication Data

US 2010/0030504 A1 Feb. 4, 2010

Related U.S. Application Data

(60) Provisional application No. 61/084,871, filed on Jul. 30, 2008.

(51) Int. Cl.
*G06F 19/00* (2011.01)
*G01R 29/26* (2006.01)

(52) U.S. Cl.
CPC .................................. *G01R 29/26* (2013.01)
USPC ............................. 702/69; 324/537; 324/605

(58) Field of Classification Search
USPC ..................................... 702/69; 324/537, 605
See application file for complete search history.

(56) References Cited

U.S. PATENT DOCUMENTS 4,998,071 A * 3/1991 Strid et al. ..................... 324/613
2006/0279275 A1 12/2006 Simpson

OTHER PUBLICATIONS

International Preliminary Report on Patentability, International Application No. PCT/US2009/051985, Feb. 10, 2011.
International Search Report and the Written Opinion of the International Searching Authority, International Application No. PCT/US 2009/051985, Apr. 1, 2010.
"A Load-Pull Wafer Mapper," by F. Vanaverbeke, et al., Microwave Symposium Digest, 2008 IEEE MIT-S International, IEEE, Piscataway, NJ, USA, Jun. 15, 2008, pp. 113-119.
"Measurement-Based Large-Signal Simulation of Active Components From Automated Nonlinear Vector Network Analyzer Data Via X-Parameters," by J. Horn et al., Microwaves, Communications, Antennas and Electronic Systems, 2008. Comcas 2008. IEEE International Conference On, IEEE, Piscataway, NJ, USA, May 13, 2008, pp. 1-6.
"Load-Pull+NVNA=Enhanced X-Parameters for PA Designs with High Mismatch and Technology-Independent Large-Signal Device Models," by G. Simpson, et al., ARFTG Microwave Measurement Symposium, 2008 72nd, IEEE, Piscataway, NJ, USA, Dec. 9, 2008, pp. 88-91.
"A 0.5-18 GHz Semi-Automatic Noise Parameter Measurement Technique," by Lane, Richard Q., 19th ARFTG Digest, Jun. 1982, pp. 42-58.
"The Determination of Device Noise Parameters," by Lane, Richard Q., Proceedings of the IEEE, vol. 57, Aug. 1969, pp. 1461-1462.
"Computer-Aided Determination of Microwave Two-Port Noise Parameters," by G. Caruso and M. Sannino, IEEE Transactions on Microwave Theory and Techniques, vol. MTT-26, No. 9, Sep. 1978, pp. 639-642.
Operating Manual, MT993-2, Rev L, Oct. 24, 2002, Automated Tuner System, Excerpt including pp. 6-1, 6-2, 6-3; Maury Microwave Corporation.

(Continued)

*Primary Examiner* — Jonathan C Teixeira Moffat
*Assistant Examiner* — Hien Vo
(74) *Attorney, Agent, or Firm* — Larry K. Roberts

(57) ABSTRACT

Methods are described for measuring data in a test setup including an impedance tuner. In an exemplary embodiment, the data is data for measuring noise parameters. The data is measured versus a sweep parameter for one tuner state at a time.

38 Claims, 10 Drawing Sheets

(56) References Cited

OTHER PUBLICATIONS

User's Guide, HP 8719C, 8720C, 8722A Network Analyzers, Hewlett-Packard, Copyright 1991, 24 pages.

Maury Microwave Application Note 5A-042, "A New Noise Parameter Measurement Method Results in More than 100x Speed Improvement and Enhanced Measurement Accuracy," Gary Simpson et al., Mar. 2009, 7 pages.

Newsletter, Automatic RF Techniques Group (ARFTG), Summer 2009, No. 41, 4 pages.

Newsletter, Automatic RF Techniques Group (ARFTG), Winter 2008, No. 40, 4 pages.

* cited by examiner

DATA MEASUREMENT METHODS AND SYSTEMS

CROSS-REFERENCE TO RELATED APPLICATION

This application claims the benefit of U.S. Provisional Application No. 61/084,871 filed Jul. 30, 2008, hereby incorporated by reference.

BACKGROUND

Noise parameters typically include a set of values that describe how the noise figure of a device varies with impedance match. The noise parameters generally vary with conditions associated with a device-under-test (DUT), such as frequency, bias, or temperature. There are different forms of the noise parameters, but generally may include a set of four (4) scalar values. A commonly used set is:
1. Fmin=minimum noise FIG.
2. Gamma_opt magnitude=magnitude of gamma_opt, the optimum source gamma that will produce Fmin
3. Gamma_opt phase=phase of gamma_opt, the optimum source gamma that will produce Fmin
4. rn=equivalent noise resistance, which determines how fast the noise figure will change as the source gamma moves away from Gamma_opt.

With this set of noise parameters, the noise figure of the device for any source impedance is then generally described by the equation $$F=F\text{min}+4*rn*|\text{gamma\_opt}-\text{gamma\_}s|^2/(|1+\text{gamma\_opt}|^2*(1-|\text{gamma\_}s|^2))$$

Where
gamma_s=source reflection coefficient seen by the DUT
F=Noise figure

Other noise parameter forms include a correlation matrix (of which there are multiple configurations), and a set with forward and reverse noise used by the National Institute for Standards and Technology (NIST). Generally, all of the noise parameter forms contain the same basic information. So if one form of the noise parameters is known, the noise parameters can be converted to any other form with a math formula.

Noise parameters are typically measured by measuring the DUT under multiple impedance conditions, in a setup similar to that shown in FIG. 1.

The traditional measurement method is to:
1. Make the preliminary system calibrations and measurements, as needed. This typically includes calibrating the measurement system s-parameters, including the tuner or tuners, so that it can later be de-embedded from the DUT measurements.
2. Calibrate the noise receiver parameters, so that the noise receiver can later be de-embedded from the DUT measurements. This is typically done per the flow diagram in FIG. 2 as follows:
   a. Measuring the data at one impedance state at a time until one frequency is complete.
   b. Go to the next frequency, and repeat step a. The set of tuner states to be used for the noise receiver calibration will typically vary from frequency to frequency. Usually, frequency is the only sweep parameter used for the noise receiver calibration, because other parameters that affect the DUT, such as DUT bias or DUT temperature, do not affect the noise receiver.
3. Measure the needed data with the DUT in place per the flow diagram in FIG. 3, as follows:
   a. Measure the needed data at one tuner state at a time until the data collection is complete at one sweep parameter value, such as frequency. From this, the noise parameters can be determined for that sweep parameter value. Instead of frequency, the sweep parameter can also be other conditions that affect the DUT performance, such as bias or temperature.
   b. Repeat the measurement in step a for each sweep parameter value of interest. The set of tuner states to be used for the DUT measurement will typically vary from one sweep parameter value to the next, as the set of multiple source impedances is typically determined independently at each swept value.

A significant limitation of the prior art is the overall measurement time. This can include setup time, tuner calibration, system calibration, receiver calibration, as well as the DUT measurement.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
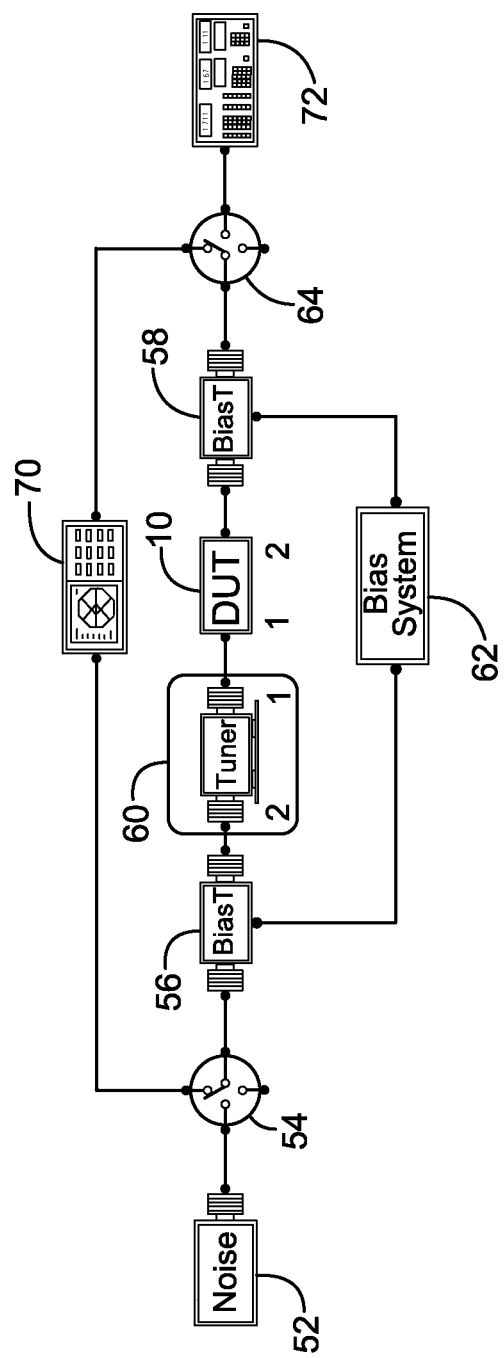
FIG. 1 is a schematic diagram illustrating a typical noise parameter measurement setup.
Figure 2:
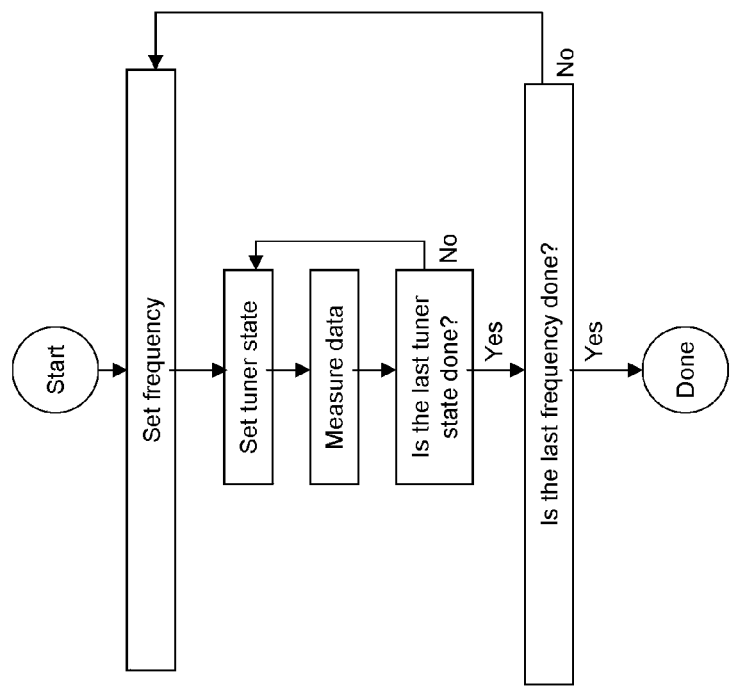
FIG. 2 is a simplified flow diagram of a noise receiver calibration sequence.
Figure 3:
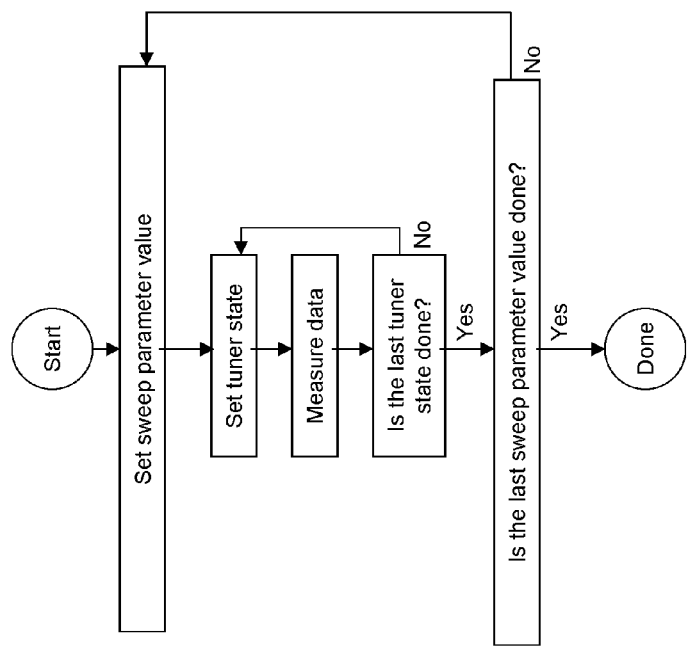
FIG. 3 is a simplified flow diagram of a DUT measurement sequence.

In the following detailed description and in the several figures of the drawing, like elements are identified with like reference numerals. The figures are not to scale, and relative feature sizes may be exaggerated for illustrative purposes.

Methods for measuring noise parameters are described that are much faster than prior methods, and may significantly speed up the overall measurement. This can include the system calibration (including tuners), the noise receiver calibration, and the DUT measurement. Exemplary embodiments of the new method can be used with, but are not limited to, the same setup as was used with the prior art. The measurement setup depicted in FIG. 1 for a device under test (DUT) 10 includes a noise source 52 connected to one port of RF switch 54. A network analyzer 70 is connected to another port of the RF switch. The RF switch is also connected through a bias T 56 to a port of impedance tuner 60. The RF switch can be set to connect the network analyzer to the tuner, or the noise source to be connected to the tuner. One port of the DUT is connected to a second port of the tuner 60. A second bias T 58 is connected to a second port of the DUT. The bias system 62 is connected to the bias Ts 56 and 58. An RF switch 64 is connected between the network analyzer 70, the bias T 58 and a noise receiver or noise figure analyzer 72, with the switch allowing signals from the bias T 58 to be passed to the network analyzer 70 or the noise figure analyzer 72.

In an exemplary embodiment, a set of impedance tuner states may be selected, that can be used over multiple values of the swept parameter (such as frequency or bias). The needed data is then collected over the needed range of the sweep parameter at one tuner state at a time. When the data is collected as a function of the sweep parameter for every selected tuner state, then the noise parameters may be determined for each value of the sweep parameter.

For example, if 16 impedance states are selected, and the sweep parameter is frequency, then a swept frequency measurement would be made at one impedance state at a time, until all 16 impedance states are completed. This can be much faster than making a single frequency measurement at each of 16 states, and then repeating that for every frequency.

The advantages of this method include

1. The impedance tuner needs only to be set to each state once, rather than moving to every selected state separately at every value of the sweep parameter.

2. Modern instruments tend to measure data much faster in a single sweep than measuring the points in the sweep one at a time.

3. Overall, this method can be much faster than a conventional method. A speed improvement of over 10 times has been demonstrated in an exemplary embodiment.

In accordance with an exemplary non-limiting embodiment, a method of selecting impedance tuner states includes using a fixed set of states for multiple values of a sweep parameter such as frequency or bias. This does not preclude using a separate set of tuner states for different bands of the sweep parameter. For example, many mechanical tuners use different mismatch probes for different frequency bands. In an implementation in which a mechanical tuner is used as the impedance tuner, a tuner state may correspond to one mechanical setting of the tuner. Further, the tuner may be provided with a means to vary reflection magnitude and phase with some degree of independence. The magnitude control has a particular response versus the tuner state, and that response versus the tuner state is measured. Then that measured response versus the tuner state may be used to automatically select magnitude control values that give a desired spread of points.

Figure 4:
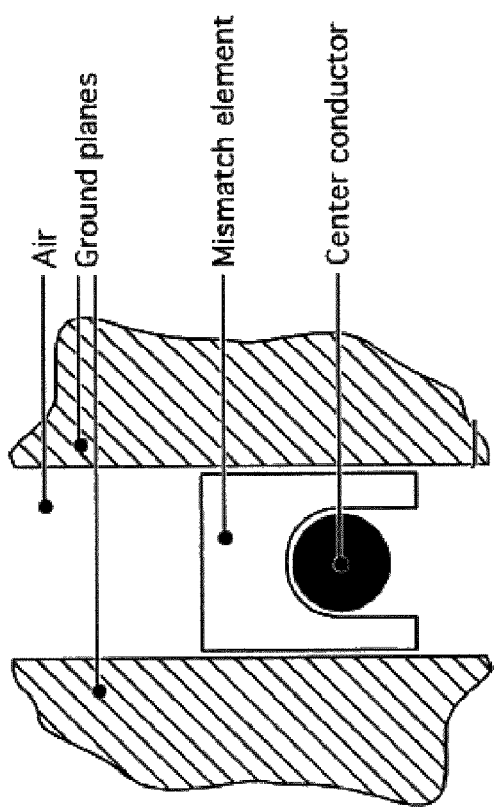
FIG. 4 is a cross section of mechanical tuner with a mismatch probe that is a variable distance from the center conductor.

An exemplary embodiment uses a mechanical slide screw tuner with a mismatch probe, as shown in FIG. 4. The magnitude control is obtained by varying the distance of the mismatch probe to the tuner center conductor. The mismatch probe can be measured versus its position at approximately its center frequency. For many mismatch probe designs, selecting a satisfactory set of probe positions for that approximate center frequency will generally produce a satisfactory reflection coefficient magnitude spread across the operating band of that mismatch probe. This can work even when the mismatch probe position also affects phase to some extent. (In practice, the phase change of most mismatch probes as a function of position is less than 180 degrees.) Methods of selecting the approximate or nominal center frequency include, but are not limited to, selecting it based on knowledge of the mismatch probe design, or by measuring the mismatch as a function of frequency and selecting the frequency with the highest mismatch. This method of selecting probe positions can generally be adapted to any type of mismatch probe, although some types might require measuring versus position at more than one frequency point.

Figure 5:
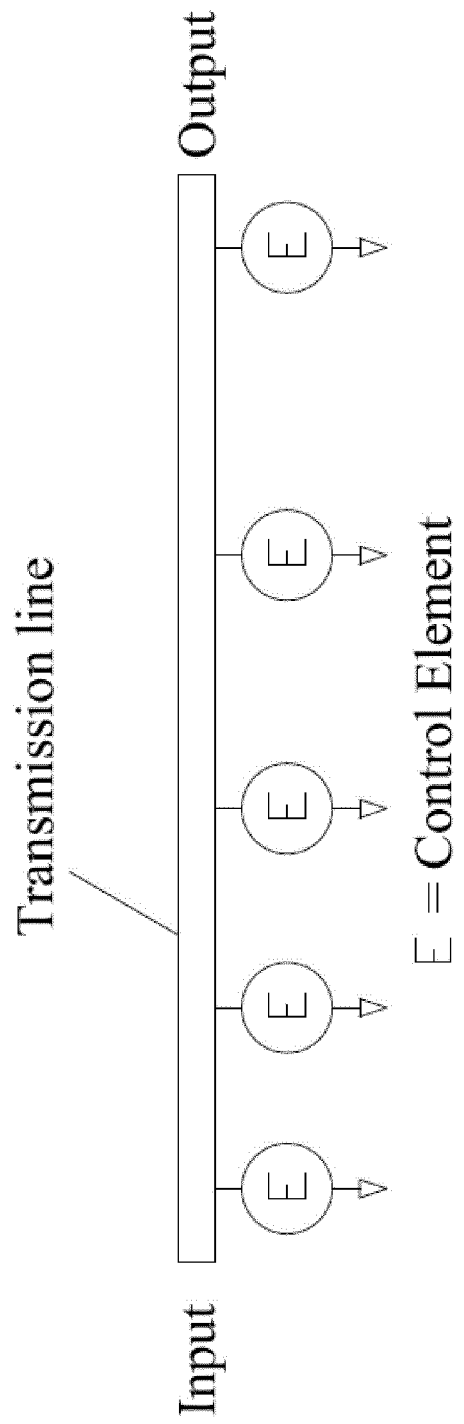
FIG. 5 is a simplified circuit diagram of a solid state tuner with control elements connected to the main transmission line.

Another exemplary embodiment employs a solid state tuner, using control elements such as PIN diodes or transistors, as shown in FIG. 5. One control value, such as the current drive of one control element can be used as the magnitude control, and another control value, such as the selection of which control element to drive, can be used for phase control. Other variations, such as using switched lines to change phase, could also be used.

Figure 6:
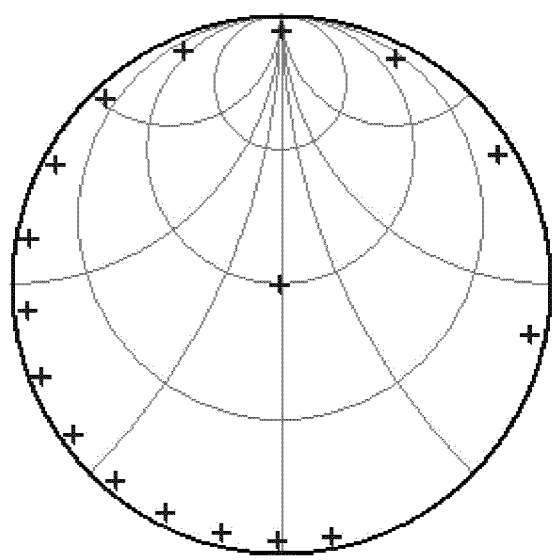
FIG. 6 graphically illustrates an example of non-uniform phase spacing displayed at one frequency.

In a further exemplary embodiment, the impedance tuner states may be selected for phase steps that are non-uniform. This means that at any particular frequency, the phase step from one phase position to the next will change as one moves through the list of phase positions. One reason is to ensure that the phase positions stay separated in the impedance plane (or on a Smith chart) over the desired frequency range. An exemplary embodiment is to use a mechanical slide screw tuner and select carriage positions with logarithmic spacing. FIG. 6 shows a Smith chart with this type of phase spacing.

In still another exemplary embodiment, the impedance tuner states may be selected for phase steps that are non-uniform and the amount of non-uniformity in the spacing can vary. The variation could be user selectable, or it may depend on some setup detail, or some setup parameter such as the total desired bandwidth to cover. For example, as the bandwidth of the sweep parameter is widened, then the phase step will change more rapidly as one moves through the list of phase positions. In that example, as the bandwidth of the sweep parameter is narrowed, then the phase step will change more slowly as one moves through the list of phase positions. In the extreme case where the sweep consists of only 1 point (the bandwidth goes to zero), then the non-uniformity could go to zero, producing uniform phase steps.

Figure 7:
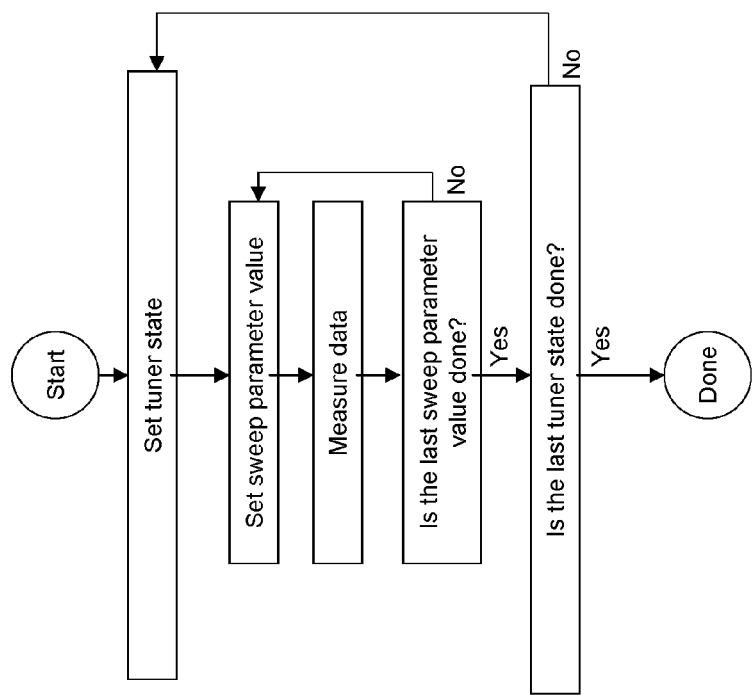
FIG. 7 is a flow diagram illustrating an exemplary noise receiver calibration sequence.
Figure 8:
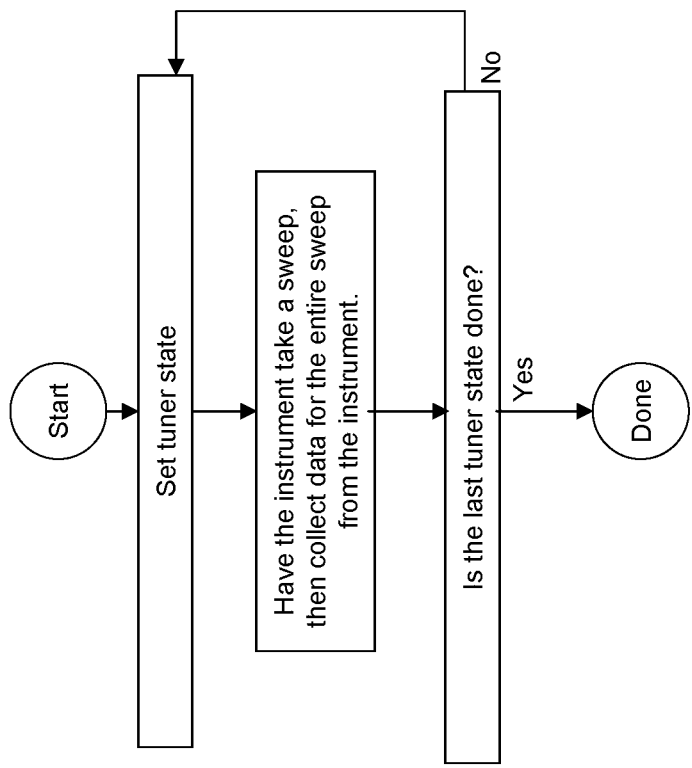
FIG. 8 is a flow diagram illustrating an alternate embodiment of a swept measurement.

In a further exemplary embodiment, a method of calibrating or measuring parameters of a noise receiver is provided, where the data is measured versus a sweep parameter for one tuner state at a time. This sequence is diagrammed in FIG. 7. An example of a typical sweep parameter could be frequency. It is noted the inside loop taking the data may not necessarily be done in the application software; the software could just trigger a measurement on the instrument and collect the data for the entire sweep at one time, as illustrated in FIG. 8. The tuner states may be selected using any of the methods described above.

In yet another exemplary embodiment, a method of measuring data for noise parameters is provided, where the data is measured as a function of a sweep parameter for one tuner state at a time. This sequence is diagrammed in FIG. 9. Examples of typical sweep parameters include frequency or bias. It is noted that the inside loop taking the data may not necessarily be done in the application software; the software may trigger a measurement on the instrument and collect the data for the entire sweep at one time, as diagrammed in FIG. 8. The tuner states may be selected using any of the methods as described above.

Another exemplary embodiment is a method of measuring data needed for noise parameters, where the data is measured as a function of a sweep parameter for one tuner state at a time, and at least one tuner in the setup is a mechanical tuner. This sequence is diagrammed in FIG. 9. Examples of typical sweep parameters include frequency or bias. It is noted that the inside loop taking the data may not necessarily be done in the application software; the software could trigger a measurement on the instrument and collect the data for the entire sweep at one time, as illustrated in FIG. 8. The tuner states may be selected using any of the methods as described above.

Figure 9:
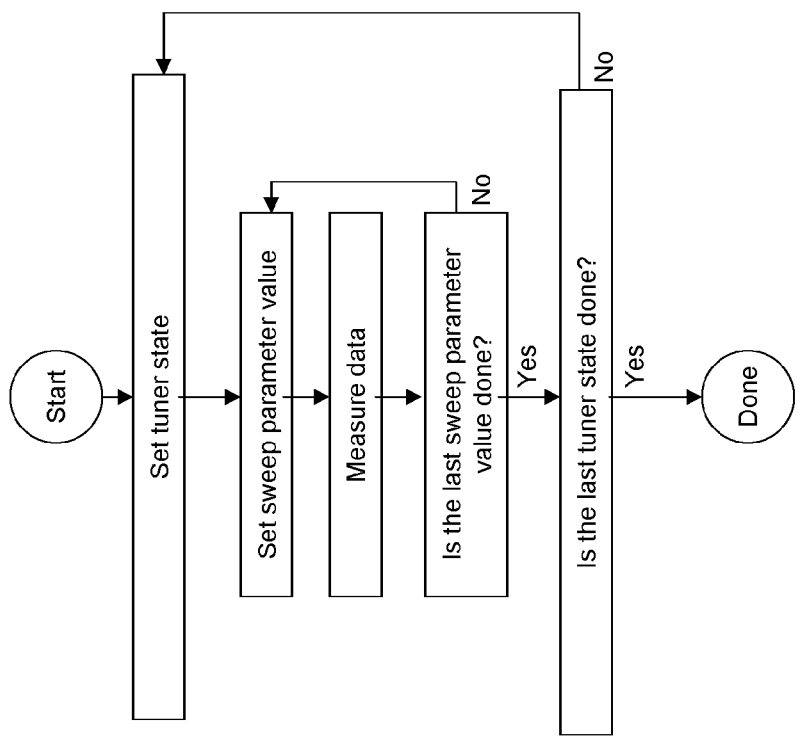
FIG. 9 is a flow diagram illustrating an exemplary DUT measurement sequence.
Figure 10:
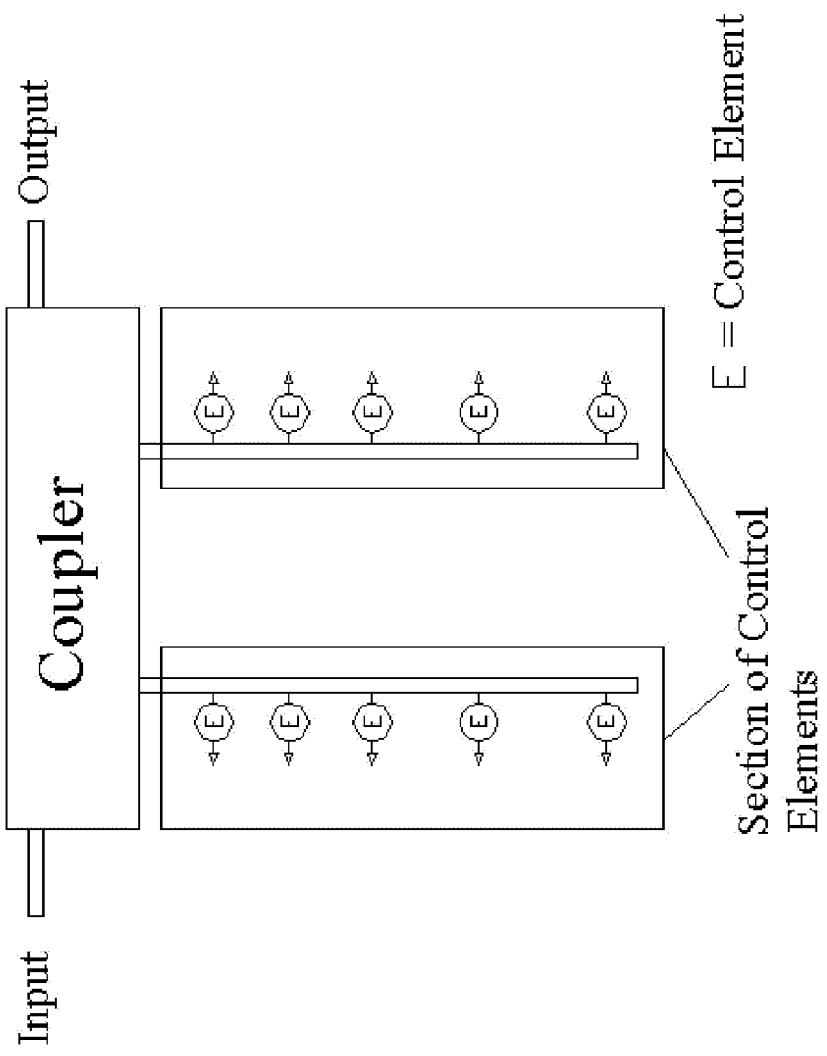
FIG. 10 is a simplified circuit diagram of an exemplary embodiment of a solid state tuner with sections of control elements connected with couplers.

A further exemplary embodiment is a method of measuring data needed for noise parameters, where the data is measured as a function of a sweep parameter for one tuner state at a time, and at least one tuner in the setup is a solid state tuner. The solid state tuner may be one of two types. The first type has one control that mostly controls reflection magnitude, and another control that mostly controls phase. An example is one that mostly controls magnitude with DC current drive through a control element (typically a PIN diode or transistor), and mostly controls phase by the selection of the control element. This example of a solid state tuner is illustrated in, although not limited to, the configuration of FIG. 5. The second type of solid state tuner is the type where sections of control elements are connected using couplers, as shown in, although not limited to, the configuration of FIG. 10. An exemplary sequence for this embodiment is illustrated in FIG. 9. Examples of typical sweep parameters include frequency or bias. It is noted that the inside loop taking the data may not necessarily be done in the application software; the software could alternatively trigger a measurement on the instrument and collect the data for the entire sweep at one time, as illustrated in FIG. 8. The tuner states may be selected using any of the methods as described above.

Another exemplary embodiment is a method of measuring data other than noise as a function of a sweep parameter for one tuner state at a time. The tuner states may be selected using any of the methods as described above.

In many cases, the measurement setup may use an impedance tuner (or tuners) with different mismatch probes for different frequency bands of operation. In that example, with frequency as the sweep parameter, this method may have to be applied band by band, but the benefit of the new method is still very significant within each band.

An aspect of a measurement method is the selection of tuner states to produce a satisfactory set of impedances at every sweep value, such as frequency. This method also significantly speeds up the calibration of the tuners and receiver.

An exemplary process for selecting tuner states is as follows. This exemplary procedure is for a mechanical tuner where magnitude is primarily controlled by the vertical position of the mismatch probe, and the horizontal movement of the carriage primarily affects phase. This exemplary procedure ensures that a good spread of impedances will be available at every frequency in the measurement band.

1. Decide on the number of magnitude values and the number of phase values to use.

2. Select a set of probe positions as follows:

a. Determine the probe response vs. position by measuring the reflection magnitude vs. mismatch probe position. (Other approaches could also be used. For example, a known response of a standard probe model could be used.)

b. From the mismatch probe response vs. position, select a set of positions that will give a reasonable reflection magnitude spread of the desired number of points over the available reflection magnitude range of the mismatch probe. This set could have uniform magnitude steps between probe positions, although that is not required.

3. Select a set of carriage positions that will give a reasonable phase spread at every frequency in the band, as follows:

a. Determine the travel length of the carriage intended to be used. An exemplary travel length is approximately one-half wavelength at the lowest frequency in the band, less the length that gives the desired phase step from the last point to the first point. Exactly one half wavelength of travel would cause the last point to duplicate the phase of the first point because of the circular property of phase.

b. Select a set of carriage positions with variable spacing that covers the actual travel length. For example, the physical spacing, or gap, between points 2 and 3 will be greater than between points 1 and 2. The gap between points 3 and 4 will be greater than between points 2 and 3. In like manner, proceeding from the first to the last point, the gap between any two points will be greater than any previous gap between two points. The distance from the first to the last point is the actual travel length.

c. Uniform spacing will give a good phase spread at one frequency, but may not work over a wide frequency band since the phase rotates faster with frequency for carriage positions farther from the DUT, causing the phases to overlap as the frequency changes.

4. Select the set of complete tuner states, consisting of all combinations of the previously determined sets of carriage positions and mismatch probe positions. In addition, add in the z0 state (typically the 50 Ohm state for coaxial tuners). The total number of states=(number of carriage positions)× (number of probe positions)+1.

This method has been described in conjunction with noise parameter measurements, but changing the measurement order to sweep as a function of some parameter at each impedance state and then determining and/or displaying the results at the end could also apply to other measurements, such as load pull of non-linear devices. The swept parameter could be any parameter supported by the load pull system.

Conventional noise parameter measurement setups normally use software to automate the measurement, including control of the instruments, collection of the data, and performing the required calculations. The software typically runs on a computer that is connected to the measurement instrumentation through one or more interfaces, such as the GPIB interface.

An exemplary implementation of a new measurement method as described above is to automate it using algorithms implemented in software. The software will control the test setup and measuring instruments, collect the required data, and then do all of the required calculations. The software may be installed on a stand-alone computer which is connected to the measuring instruments through one or more interfaces, such as the GPIB interface. The software can also be installed into modern instruments that contain appropriate computer hardware. For example, an exemplary software implementation was installed into an Agilent PNA-X (model N5242A), which is an instrument that combines a network analyzer, a noise receiver, RF switches, bias tees and a computer into one box. In a general sense, then, the software algorithms may be considered installed on the test setup on either a stand-alone computer or into a measuring instrument of the test setup.

Although the foregoing has been a description and illustration of specific embodiments of the subject matter, various modifications and changes thereto can be made by persons skilled in the art without departing from the scope and spirit of the invention.

What is claimed is:

1. A method of measuring data for noise parameters in a test setup including an impedance tuner, comprising:
   (i) setting a tuner state to one of a set of tuner states;
   (ii) setting a sweep parameter to a value in a set of multiple sweep parameter values;
   (iii) measuring data at said tuner state and sweep parameter value;
   (iv) repeating steps (ii) and (iii) for a different sweep parameter value in said set of multiple sweep parameter values until data has been measured for all sweep parameter values in said set;

(v) changing the tuner state to another of said tuner states in said set of tuner states;

(vi) repeating steps (ii), (iii), (iv) and (v) until data has been measured for each of said tuner states in said set of tuner states, wherein the data is measured as a function of the sweep parameter for said set of parameter values for one tuner state at a time.

2. The method of claim 1, wherein said sweep parameter is frequency.

3. The method of claim 1, wherein said sweep parameter is bias applied to a device under test.

4. The method of claim 1, wherein the impedance tuner is a mechanical tuner, and each tuner state in said set of tuner states corresponds to one mechanical setting of said mechanical tuner.

5. The method of claim 1, further comprising:
selecting said set of tuner states to vary reflection magnitude and phase, to produce a set of impedances at every sweep parameter value such that reflection magnitude and phase positions corresponding to the different tuner states are separated in an impedance plane at every sweep parameter value.

6. The method of claim 5, wherein the impedance tuner is a mechanical slide screw tuner with a mismatch probe and a tuner center conductor, and said tuner states include a set of tuner states with the mismatch probe positioned at various distances from the center conductor, each set having a different impedance magnitude.

7. The method of claim 6, wherein the sweep parameter is frequency, and each of said set of tuner states is selected at a probe position for an approximate center frequency of the mismatch probe to produce a satisfactory reflection coefficient magnitude spread of points over an operating frequency band of the mismatch probe.

8. The method of claim 5, wherein said tuner is a solid state tuner, using a plurality of solid state control elements, and wherein a first control parameter value is primarily used for a magnitude control, and a second control parameter value is primarily used for a phase control.

9. The method of claim 8, wherein the first control parameter is the current drive of one control element, and the second control parameter is a selection of which of said plurality of solid state control elements to drive.

10. The method of claim 8 wherein sections of said control elements are connected by couplers.

11. The method of claim 5, wherein the tuner states are selected for phase steps that are non-uniform.

12. The method of claim 11, wherein the method is practiced using a mechanical slide screw tuner and carriage positions are selected with logarithmic spacing.

13. The method of claim 1, wherein the tuner states are selected for phase steps that are non-uniform.

14. The method of claim 13, wherein the non-uniformity in the phase step spacing varies with frequency bandwidth.

15. The method of claim 1, wherein the test setup includes a noise receiver or analyzer, and said data for noise parameters is collected for calibrating or measuring parameters of the noise receiver or analyzer.

16. The method of claim 1, wherein the test setup further includes a noise receiver or analyzer, further comprising:
using the measured data to determine noise parameters of a device under test.

17. An automated test setup, wherein the method of claim 1 is implemented by computer software algorithms installed on the test setup.

18. A method of measuring data for noise parameters in a test setup including an impedance tuner, comprising:
(i) setting a tuner state to one of a set of tuner states;
(ii) setting a sweep parameter to a value in a set of multiple sweep parameter values;
(iii) measuring data at said tuner state and sweep parameter value;
(iv) repeating steps (ii) and (iii) for a different sweep parameter value in said set of multiple sweep parameter values until data has been measured for all sweep parameter values in said set;
(v) changing the tuner state to another of said tuner states in said set of tuner states;
(vi) repeating steps (ii), (iii), (iv) and (v) until data has been measured for each of said tuner states in said set of tuner states, wherein the data is measured as a function of the sweep parameter for said set of parameter values for one tuner state at a time; and where the tuner includes means for varying reflection magnitude and phase with some degree of independence, said means for varying has a particular response as a function of the tuner state, the method further comprises selecting said set of tuner states, and said selecting step comprises:

measuring the response of the magnitude means for varying as a function of the tuner state;

using said measured response as a function of tuner state to select magnitude control values that give a desired spread of points.

19. The method of claim 18, wherein said sweep parameter is frequency.

20. The method of claim 18, wherein said sweep parameter is bias applied to a device under test.

21. The method of claim 18, wherein the impedance tuner is a mechanical tuner with a center conductor and a mismatch probe, and the means for varying reflection magnitude comprises a mismatch probe whose distance from the center conductor can be varied.

22. The method of claim 18, further comprising:
selecting said set of tuner states to vary reflection magnitude and phase, to produce a set of impedances at every sweep parameter value such that reflection magnitude and phase positions corresponding to the different tuner states are separated in an impedance plane at every sweep parameter value.

23. The method of claim 22, wherein the impedance tuner is a mechanical slide screw tuner with a mismatch probe and a tuner center conductor, and said tuner states include a set of tuner states with the mismatch probe positioned at various distances from the center conductor, each set having a different impedance magnitude.

24. The method of claim 23, wherein the sweep parameter is frequency, and each of said set of tuner states is selected at a probe position for an approximate center frequency of the mismatch probe to produce a satisfactory reflection coefficient magnitude spread of points over an operating frequency band of the mismatch probe.

25. The method of claim 22, wherein said tuner is a solid state tuner, using a plurality of solid state control elements, and wherein a first control parameter value is primarily used for a magnitude control, and a second control parameter value is primarily used for a phase control.

26. The method of claim 25, wherein the first control parameter is the current drive of one control element, and the second control parameter is a selection of which of said plurality of solid state control elements to drive.

27. The method of claim 25 wherein sections of said control elements are connected by couplers.

28. The method of claim 22, wherein the tuner states are selected for phase steps that are non-uniform.

29. The method of claim 28, wherein the method is practiced using a mechanical slide screw tuner and carriage positions are selected with logarithmic spacing.

30. The method of claim 18, wherein the tuner states are selected for phase steps that are non-uniform.

31. The method of claim 30, wherein the non-uniformity in the phase step spacing varies with frequency bandwidth.

32. The method of claim 18, wherein the test setup includes a noise receiver or analyzer, and said data for noise parameters is collected for calibrating or measuring parameters of the noise receiver or analyzer.

33. The method of claim 18, wherein the test setup further includes a noise receiver or analyzer, further comprising:
using the measured data to determine noise parameters of a device under test.

34. An automated test setup, wherein the method of claim 18 is implemented by computer software algorithms installed on the test setup.

35. The method of claim 18, wherein said data for noise parameters include data sufficient to determine the noise figure F of a device under test.

36. The method of claim 18, wherein said data is sufficient to determine a set of noise parameters, including:
Fmin=minimum noise figure;
Gamma_opt magnitude=magnitude of gamma_opt, the optimum source gamma that will produce Fmin;
Gamma_opt phase=phase of gamma_opt, the optimum source gamma that will produce Fmin;
rn=equivalent noise resistance, which determines how fast the noise figure will change as the source gamma moves away from Gamma_opt.

37. A method of measuring data for noise parameters in a test setup including an impedance tuner, comprising:
(i) setting a tuner state to one of a set of tuner states;
(ii) setting a sweep parameter to a value in a set of multiple sweep parameter values;
(iii) measuring data at said tuner state and sweep parameter value;
(iv) repeating steps (ii) and (iii) for a different sweep parameter value in said set of multiple sweep parameter values until data has been measured for all sweep parameter values in said set;
(v) changing the tuner state to another of said tuner states in said set of tuner states;
(vi) repeating steps (ii), (iii), (iv) and (v) until data has been measured for each of said tuner states in said set of tuner states,
wherein the data is measured as a function of the sweep parameter for said set of parameter values for one tuner state at a time; and
wherein said data for noise parameters include data sufficient to determine the noise figure F of a device under test.

38. A method of measuring data for noise parameters in a test setup including an impedance tuner, comprising:
(i) setting a tuner state to one of a set of tuner states;
(ii) setting a sweep parameter to a value in a set of multiple sweep parameter values;
(iii) measuring data at said tuner state and sweep parameter value;
(iv) repeating steps (ii) and (iii) for a different sweep parameter value in said set of multiple sweep parameter values until data has been measured for all sweep parameter values in said set;
(v) changing the tuner state to another of said tuner states in said set of tuner states;
(vi) repeating steps (ii), (iii), (iv) and (v) until data has been measured for each of said tuner states in said set of tuner states,
wherein the data is measured as a function of the sweep parameter for said set of parameter values for one tuner state at a time; and
wherein said data is sufficient to determine a set of noise parameters, including:
Fmin=minimum noise figure;
Gamma_opt magnitude=magnitude of gamma_opt, the optimum source gamma that will produce Fmin;
Gamma_opt phase=phase of gamma_opt, the optimum source gamma that will produce Fmin;
rn=equivalent noise resistance, which determines how fast the noise figure will change as the source gamma moves away from Gamma_opt.

* * * * *